(12) United States Patent
Goto

(10) Patent No.: US 6,587,182 B1
(45) Date of Patent: Jul. 1, 2003

(54) ILLUMINATION APPARATUS

(75) Inventor: Akihiro Goto, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/534,750

(22) Filed: Mar. 24, 2000

(30) Foreign Application Priority Data

Mar. 26, 1999 (JP) .......................................... 11-083093

(51) Int. Cl.[7] ........................ G03B 27/72; G03B 27/42; G03B 27/54
(52) U.S. Cl. ............................... 355/71; 355/53; 355/67
(58) Field of Search ............................ 355/53, 55, 57, 355/67–71; 372/93; 359/618, 629

(56) References Cited

U.S. PATENT DOCUMENTS

| | | | | | |
|---|---|---|---|---|---|
| 4,035,070 A | * | 7/1977 | Hammond | ................. | 355/3 R |
| 5,224,200 A | * | 6/1993 | Rasmussen et al. | ........ | 385/146 |
| 5,739,899 A | * | 4/1998 | Nishi et al. | .................... | 355/53 |
| 5,861,991 A | * | 1/1999 | Fork | .......................... | 359/618 |

FOREIGN PATENT DOCUMENTS

WO     WO 00/02092 A1     1/2000

* cited by examiner

*Primary Examiner*—Henry Hung Nguyen
(74) *Attorney, Agent, or Firm*—Birch, Stewart, Kolasch & Birch, LLP

(57) ABSTRACT

A compact illumination apparatus reduces nonuniformity in the Gaussian intensity distribution of a laser beam and reduces interference noise due to an optical integrator. The illumination apparatus illuminates a mask with a predetermined pattern. A light source supplies a light beam. The light beam is split into multiple beams by multiple reflections between a totally reflective surface and a partially reflective surface. The totally reflective and partially reflective surfaces being inclined with respect to each other. The multiple beams are split to form multiple light source images.

38 Claims, 9 Drawing Sheets

ILLUMINATION APPARATUS

FIELD OF THE INVENTION

This invention pertains to illumination apparatuses that are suitable for photo optical systems, particularly for projecting and exposing semiconductor or liquid-crystal patterns, which are formed onto masks, onto photosensitive substrates. This invention further pertains to projection and exposure apparatuses and exposing methods that use said illumination apparatuses.

BACKGROUND OF THE INVENTION

In the recent years, projection and exposure apparatuses that use a KrF excimer laser as a light source, particularly semiconductor manufacturing projection and exposure apparatuses (KrF excimer stepper) have been produced. FIG. 6 is a schematic diagram of a projection and exposure apparatus with prior art illumination apparatus equipped. After a beam generated from a KrF excimer laser 100 has been expanded by using a beam expander 102, said expanded light beam is reflected with a vibration mirror 104, and said reflected light enters a fly eye lens 106. The beam whose wave front is divided by using the fly eye lens 106 illuminates a reticle 110 via a condenser lens 108. A circuit pattern displayed onto reticle 110 is transferred onto a wafer 114 by using a projecting lens 112. In this case, a single exposure is performed by several tens of pulse radiations. The fly eye lens 106 is a necessary element for correction of an nonuniform intensity of the Gaussian distribution which the laser beam has. However, the beam whose wave front is divided by the fly eye lens 106, is overlapped onto the reticle again, an interference noise is generated onto the reticle. As for a first prior art projection and exposure apparatus shown in FIG. 6, the angle of vibration mirror 104 is adjusted per pulse radiation by using a mechanism as not shown in the drawing, the interference noise is averaged and from this, the distribution of the illumination intensity on the reticle is made to be uniform.

FIG. 7 is a schematic diagram of an illumination apparatus disclosed in Japanese unexamined patent application No. S63-216338, which is a second projection and exposure apparatus. A light beam radiated from an excimer laser 200 is converted into a group of beams parallel to the line direction, which are as the same number as that of element lenses of a fly eye lens 204, by using a multi-reflection mirror system (a multi-beam optical system) 202 that comprises a total reflection mirror 202C and a partial reflection mirror 202R. Each beam enters each element lens of fly eye lens 204. A beam radiated from a secondary light source 206 that is formed corresponding to each element lens is radiated onto a mask (a reticle) 210 by a condenser lens 208. As for said prior art projection and exposure apparatus, by adjusting the distance between total reflection mirror 202C and partial reflection mirror 202R, the difference in length of the beam passage of each beam is determined so as to be the distance that can be interfered by excimer laser 200 or longer. When the difference is determined as described above, beam waves generated from the fly eye lens 204 do not interfere with each other; as a result, an interference noise is not generated onto a mask (a reticle).

FIG. 8 is a diagram illustrating a third illumination apparatus and a projection and exposure apparatus that equips said illumination apparatus as disclosed in Japanese unexamined patent application No. H10-125585. A two-dimensional multi-beam forming optical system 308 that comprises a first one-dimensional multi-beam forming optical system 310 and a second one-dimensional multi-beam forming optical system 312 forms a group of N×M numbers of two-dimensional beams from a beam generated from a laser light source 300. The group of said N×M numbers of said two-dimensional beams enter a fly eye lens 320a, a condenser lens 322a, a fly eye lens 320b, a condenser lens 322b, and a reticle 328 in that order. The first multi-beam optical system 310 and the second multi-beam optical system 312 are orthogonally arranged; the difference in length of the light passages of the first and second multi-beam optical systems is optimized such that all the beams do not interfere with each other. The reflection ratio of each section of the partial reflection mirror that is a component of the first and the second multi-beam optical systems is also optimized such that each intensity of two-dimensional beam arrays that are subsequently generated. Each beam generated from the multi-beam optical system is made to enter the fly eye lens 320a while it is expanded to an effective diameter of the element lens of the fly eye lens or larger by using diffusion plates 314a and 314b.

As for excimer lasers which are light sources for projection and exposure apparatuses, the width of the wave length has been reduced. For said reason, in addition to the time coherence, the spatial coherence of recent excimer lasers has also increased in comparison with that of conventional excimer lasers. As the spatial coherence increases, the contrast of interference noises by using the fly eye lenses increases. Said interference noises cause pattern transferring errors when they are superimposed onto circuit patterns. More specifically, ununiform exposure components that have a fine structure increase. When an exposure apparatus is structured with the first prior art illumination apparatus as described above, using a KrF excimer laser having a narrower width of wave length and when an exposure is made with several tens of pulses, the Gaussian intensity distribution of the laser beam can be averaged; however, fine interference noises cannot be sufficiently averaged, which is a disadvantage of the prior art. When the number of exposure pulses (an average number) is increased while reducing the exposure intensity, the interference noises are reduced; however, the throughput also decreases.

The second prior art is a method to reduce the effect of a spatial coherence without increasing the number of exposure pulses. The second prior art method aims to obtain an effect equivalent to the increase of exposure pulses, by converting a beam from a light source into multiple beams that do not interfere with each other.

However, when a projection and exposure apparatus is provided by using the illumination apparatus, it is necessary to increase the number of multiple beams to 50 or more in order to reduce the effect of an interference noise when a single reflection layer is used. For said reason, the size of a multi-beam optical system increases in the reflecting direction of the beams. Additionally, because each beam is projected to an element lens of a fly eye lens without expanding it, the nonuniformity of the intensity with the Gaussian distribution is presented, which is specific to laser beams. It is also difficult to project a beam having a uniform shape to each element lens of a fly eye lens. Therefore, when the illumination apparatus is used, an illumination with a practical uniformity cannot be obtained as similarly to the other case as described above; the uniformity of intensity on a reticle cannot be sufficiently improved; as a result, a pattern transfer error occurs. More specifically, as for the embodiments shown in FIGS. 6 and 7, either of the disadvantages, such as the nonuniformity of the Gaussian intensity distribution or the interference noise generated by a fly eye lens, can be solved; however, but not both at the same time.

The third prior art illumination apparatus is compact and does not reduce the throughput; said illumination apparatus also has a structure such that both ununiformity of the Gaussian intensity distribution and interference noise of a fly eye lens can be reduced at the same time. As for the third prior art illumination apparatus, in order to reduce ununiformity of the Gaussian intensity distribution, the effective diameter of each beam generated is expanded to the effective diameter of an element lens of the fly eye lens or larger. In order to generate multiple compact incoherent beams, two one-dimensional multi-beam optical systems are arranged orthogonally; the differences in length of the beam passages generated in the first multi-beam optical system and the second multi-beam optical system are adjusted to different values.

However, as in the third prior art illumination apparatus, it is necessary to align a beam which is sequentially generated by a repetitive reflection within a predetermined effective diameter of each partial reflection mirror; it is difficult to adjust said beam. Further, when a multi-beam optical system is formed, it is necessary to have a process that vapor-deposits multiple types of partial reflection mirrors with various transmissivities (or reflection rates) onto a single substrate; for said reason, the manufacturing cost increases. As stated in the foregoing, according to the third prior art illumination apparatus, it is difficult to attain a low interference noise, a lower cost, and a high throughput at the same time.

Next, problems pertaining to the increase in size of the second prior art illumination apparatus is further discussed in detail. FIG. 9 is a diagram of a one-dimensional multi-beam optical system as in the second prior art example. In this case, the direction of an incident beam is indicated by an axis z; the direction of a repetitive reflection is indicated by an axis y; the direction perpendicular to the sheet surface is indicated by an axis x. As for said structure shown in FIG. 9, total reflection mirror 202C with an r0 energy reflection rate and a partial reflection mirror 202R with an r energy reflection rate are arranged in parallel facing each other. While an incident beam T0 partially transmits mirror 202R, it repeatedly reflects between two mirrors; by means of this, incident beam T0 is converted into multiple beams parallel to each other. In this case, when the difference in length of the beam passage of each beam is adjusted to a time coherence distance of the light source or more, the interference noise can be reduced.

In FIG. 9, an installing angle θ in relation to incident beam T0 and a vertical distance d of two mirrors are indicated by the following formulas:

$$\theta = \tan^{-1}(h/L) \quad (1)$$

$$d = h/(2 \sin \theta) \quad (2)$$

In this case, L stands for a difference in length of light passages between ABC and AD; h stands for a vertical distance of each beam. The difference in length L is set equal to or greater than a time coherence distance Lc of the light source in order to reduce the interference noise. Due to a geometric limitation, it is necessary to adjust h to a beam width equal to or greater than direction y. Accordingly, θ and d are determined because of these limitations.

Next, the degree of the reduction of the interference noise as shown in FIG. 9 is calculated. Here, a case where a reflected last beam escapes without the effective diameter, and the energy is lost is considered. As indicated in FIG. 9, when a reflected beam that has reflected last is defined as the nth beam, an energy Rn of said nth beam is indicated by the following formula using reflection ratios r and r0.

$$Rn = r \cdot (r \cdot r0)^{n-1} \quad (3)$$

In this case, the energy of the incident beam is defined as 1. When formula (3) is solved in relation to n, the following formula is obtained.

$$n = \ln(Rn/r)/\ln(r \cdot r0) + 1 \quad (4)$$

When r, r0, and Rn are given to formula (4), a termination beam number for the last beam n is determined. When n is defined, an effective diameter Y in the direction y is given by the following formula:

$$Y = (n-1) \cdot h \quad (5)$$

Because the right side of formula (4) is a real number, n is determined as a value that count fractions as one said real number value.

Next, as for the degree of the reduction of the interference noise under a condition that the energy of a beam reflected at last at the nth stays within 1% of the incident energy, the cases when r0 is 99% (fixed) and when r is 80% and 96% are described. h is defined as 3 mm; the interference noise is assumed to be a speckle pattern.

First, as each intensity of n number of one-dimensional multi-beams is defined as Tk (k=1 to n) and as the distribution of speckle intensity in which each beam forms onto the reticule surface is defined as Ik (x,y) (k=1 to n), the distribution of the total intensity is given by the following formula:

$$I(x,y) = I_1(x, y) + I_2(x, y) + \ldots + I_n(x,y) \quad (6)$$

The degree of the reduction of the interference noise is calculated by simulating statistic fluctuation a of I(x,y) inside the reticule surface in relation to average value <I>. When the calculation is made, it is assumed that the average value of Ik is proportioned to each beam intensity Tk; accordingly, an effect such that beam intensity Tk varies at each beam is incorporated. Tk is given by the following formula as the energy transmissivity of the partial reflection mirror is defined as t:

$$Tk = t \cdot (r \cdot r0)^{(n-1)k-1}$$

Since, in a general reference about the interference noise, $C = \sigma/<I>$ is called a speckle contrast and is defined as the degree of the interference noise, said definition is used for the simulation in this application. When n=1, speckle contrast C is standardized so as to be 100%. When contrast C is calculated, a transmissivity t of partial reflection mirror 202C is commonly presented at a denominator and a numerator; as a result, C does not depend on t.

Table 1 as shown below indicates n in relation to r of the partial reflection mirror, Y, and C by a computer simulation.

TABLE 1

| r | n | Y | C |
|---|---|---|---|
| 80% | 40 | 120 mm | 24.3% |
| 96% | 91 | 273 mm | 16.1% |

As is clear from Table 1, it is evident that the interference noise C is reduced by increasing r; however, it is also evident that effective the diameter Y in the direction y increases. This effect can be described with respect to the fact that, as r increases, the number of effective multiple beams n increases. More specifically, as n (the number of reflections) increases, the averaging of the interference noise easily occurs; and on the other hand, the effective diameter in the direction y increases according to formula (5).

As for a measure to reduce the effective diameter in the direction y, after the beam width has been reduced, beam distance h can be reduced. However, because the beam width and the beam divergence angle are generally inversely proportional to each other, even when the beam distance h is reduced by reducing the beam width at an incident location, the beam is expanded while the reflection is repeated; it is substantially difficult to reduce the effective diameter.

In addition, the reason that the loss of energy Rn of the last beam reflected the nth time occurs is because a nth reflection surface exists. For said reason, in order to reduce said loss, the nth reflection surface can be replaced with a anti-reflection coat (henceforth referred to as "an AR coat"), or the reflection surface per se can be entirely removed. In this case, as r0, r, and Y are determined such that the intensities of an nth transmission beam Tn and a first transmission beam T1 are approximately equivalent, it is known from analysis that the interference noise can be efficiently reduced. However, in this case also, in order to further reduce the interference noise, r has to be increased, and the effective diameter in the returning direction has to be increased along with the increase of the number of reflections.

SUMMARY OF THE INVENTION

The present invention is produced in consideration of disadvantages as described above; the present invention aims to offer a compact and simple illumination device that can reduce ununiformity of the Gaussian intensity distribution due to a laser beam and an interference noise due to an optical integrator at the same time. Additionally, the present invention secondarily aims to offer a projection and exposure apparatus that uses said illumination apparatus and an exposing method.

In order to eliminate said disadvantages, the present invention offers an illumination apparatus that illuminates a mask with a predetermined pattern formed, characterized by comprising the following components: a light source that supplies a beam; a multi-beam generating optical system that consists of a reflecting member and a light splitting member, and converts the beam from said light source into a group of multiple beams; an optical integrator that splits the light from said light source and forms multiple light source images; wherein in the multi-beam generating optical system, said light splitting member is provided at a predetermined angle with respect to the reflecting member, and forms a plurality of beams by repeatedly reflecting the beam from said light source between said reflecting member and said light splitting member.

In a preferred embodiment of the present invention, during said multiple reflections, said predetermined angle is preferably adjusted so as to return the reflection light that has been reflected for a predetermined number of times returns in a direction of incidence.

In another preferred embodiment of the present invention, said multi-beam generating optical system is preferably structured such that among said group of multiple beams, the difference in length of two beams adjacent to each other is adjusted to be equivalent to the coherence length or longer, which is determined by a time coherence of said light source.

In another preferred embodiment of the present invention, a condenser optical system that guides the light passing through said optical integrator to said mask is preferably provided.

In another preferred embodiment of the present invention, at the incident surface of said optical integrator, a dispersion section that disperses each beam such that the diameter becomes larger than that of an element lens of said optical integrator, is preferably further provided.

In another preferred embodiment of the present invention, a relay lens system is preferably further provided between said dispersion section and said optical integrator.

The present invention also offers a projection and exposure apparatus characterized by comprising the following components: a first stage that holds said mask; an illumination apparatus that illuminates said mask as mentioned in any description above; a second stage that holds a substrate to be exposed; and a projection optical system that projects and exposes a pattern image of the mask, which is illuminated by using said illumination apparatus, on the substrate to be exposed.

In another preferred embodiment of the present invention, said projection and exposure apparatus is a scanning projection and exposure apparatus that makes a relative movement, and the scanning direction on said substrate to be exposed and the direction in which said group of multiple beams are arranged are preferably approximately equivalent.

The present invention also offers an exposing method that uses an illumination apparatus as mentioned in any description above, characterized by comprising the following steps: a step of illumination that illuminates said mask provided onto the object surface; and a step of projection that projects a pattern image of said mask onto a photosensitive substrate provided onto a final image surface.

DESCRIPTION OF PREFERRED EMBODIMENT

Figure 1:
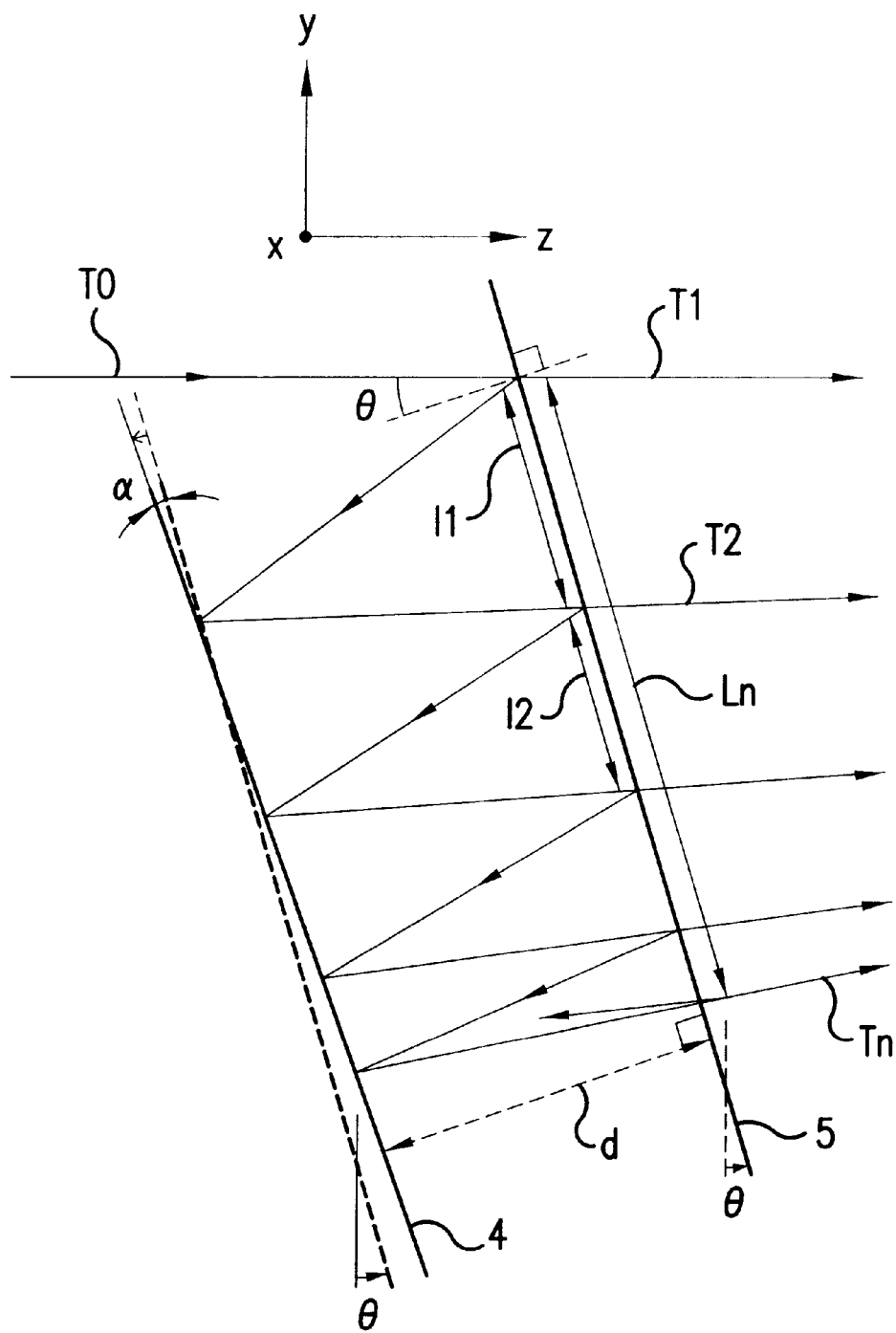
FIG. 1 illustrates a principle of the present invention.
Figure 9:
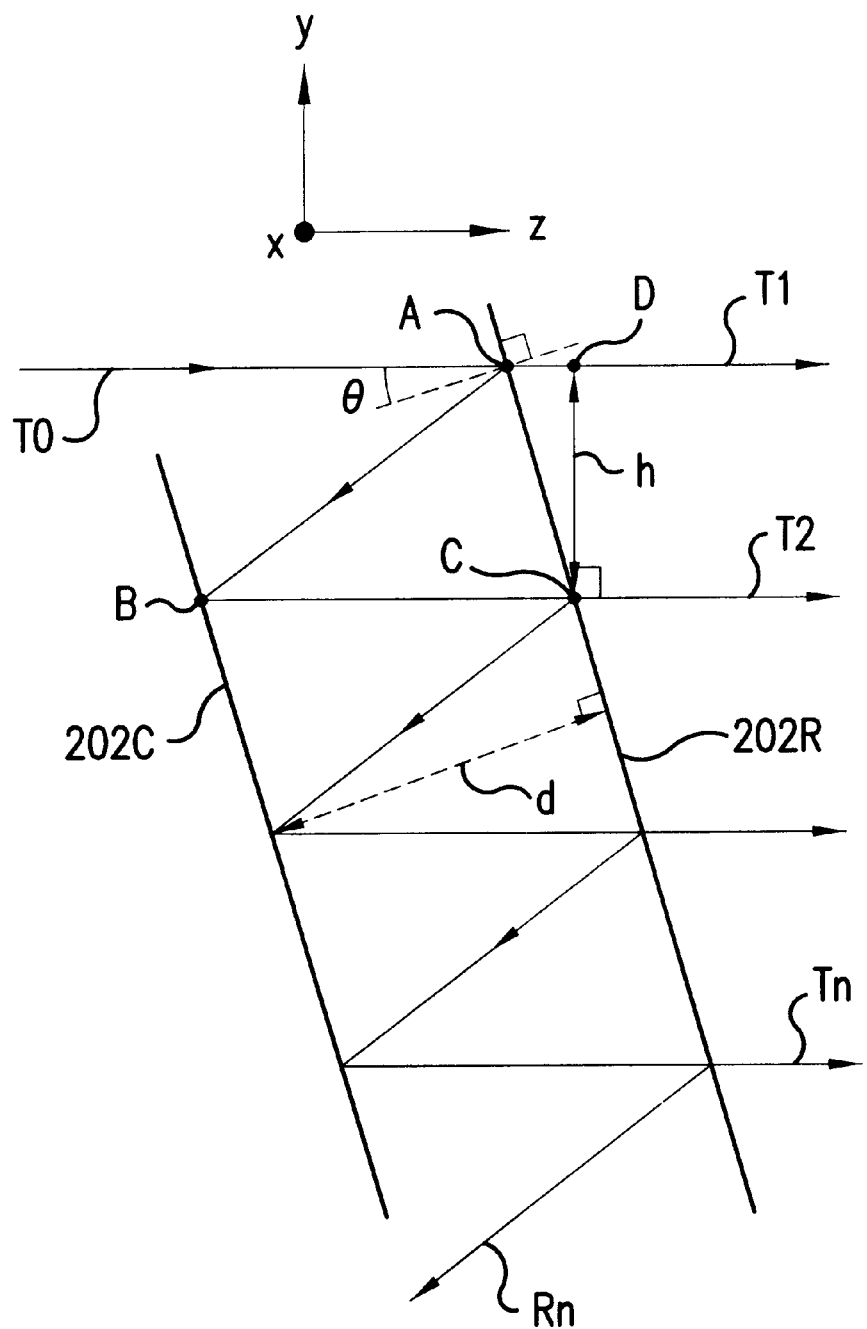
FIG. 9 illustrates a principle of the second prior art example.

The principle of a multi-beam optical system of an illumination apparatus of the present invention is described with reference to FIG. 1. As for the definitions of x, y, and z coordinates, the direction of an incident beam is defined as a z axis; the direction of a repetitive reflection is defined as a y axis; the direction vertical to the sheet surface is defined as an x axis, as similar to FIG. 9. In FIG. 1, a relative angle of a total reflection mirror 4 and a partial reflection mirror 5 is inclined by α degree from a parallel state. Here, a partial reflection mirror 5 is provided an angle θ determined by formula (1), and the installing angle of a total reflection mirror 4 is displaced by a degree from the angle θ. A distance d between the total reflection mirror 4 and the partial reflection mirror 5 (measured in relation to the normal direction of partial reflection mirror 5) is adjusted so as to be equal to or greater than a distance d given by formula (2) even at a location most adjacent within the effective diameter also. The arrow direction associating with α and θ indicates a positive direction.

First, the effective diameter in direction y is calculated with respect to the direction parallel to total reflection mirror 4. When θ is small, said obtained value and the effective diameter in direction y is approximately equivalent.

As shown in FIG. 1, a distance l1 between first transmission beam T1 and a second transmission beam T2 is indicated as below:

$$l1 = d \cdot \sin\theta + d \cdot \sin(\theta - 2\alpha) \quad (7)$$

When values from a distance l2 between the second transmission beam and the third transmission beam up to a distance l(n−1) between the n−1th transmission beam and the nth transmission beam are calculated in a similar manner, the following formulas are obtained:

$$l2 = d \cdot \sin(\theta - 2\alpha) + d \cdot \sin(\theta - 4\alpha)$$

$$l3 = d \cdot \sin(\theta - 4\alpha) + d \cdot d \cdot \sin(\theta - 6\alpha) \; l(n-1) = d \cdot \sin[\theta - 2(n-2)\alpha] + d \cdot \sin[\theta - 2(n-1)\alpha] \quad (8)$$

A distance Ln from the first transmission beam to the nth transmission beam is obtained by adding values from l1 to l(n−1) and by the following formula:

$$Ln = l1 + l2 + \ldots + l(n-1) = d \cdot \sin\theta + 2d[\sin(\theta - 2\alpha) + \sin(\theta - 4\alpha) + \ldots + \sin[\theta - 2(n-2)\alpha] + d \cdot \sin[\theta - 2(n-1)\alpha] \quad (9)$$

By applying an approximation formula sin X=X to formula (9) when θ and α are small, the following formulas are obtained:

$$Ln = d \cdot \theta + 2d[[\theta - 2\alpha] + [\theta - 4\alpha] + \ldots +$$

$$[\theta - 2(n-2)\alpha]] + d[\theta - 2(n-1)\alpha]$$

$$= d \cdot \theta + 2d[(n-2)\theta - 2\alpha[1 + 2 + \ldots + (n-2)]]$$

$$+ d[\theta - 2(n-1)\alpha]$$

$$= 2d(n-1)[\theta - (n-1)\alpha] \quad (10)$$

According to formula (10), distance Ln between the emitting point of the first transmission beam T1 and that of the nth transmission beam Tn decreases as α increases; it is evident that, when a satisfies the following formula, Ln=0 is obtained:

$$\alpha = \theta/(n-1) \quad (11)$$

Figure 2:
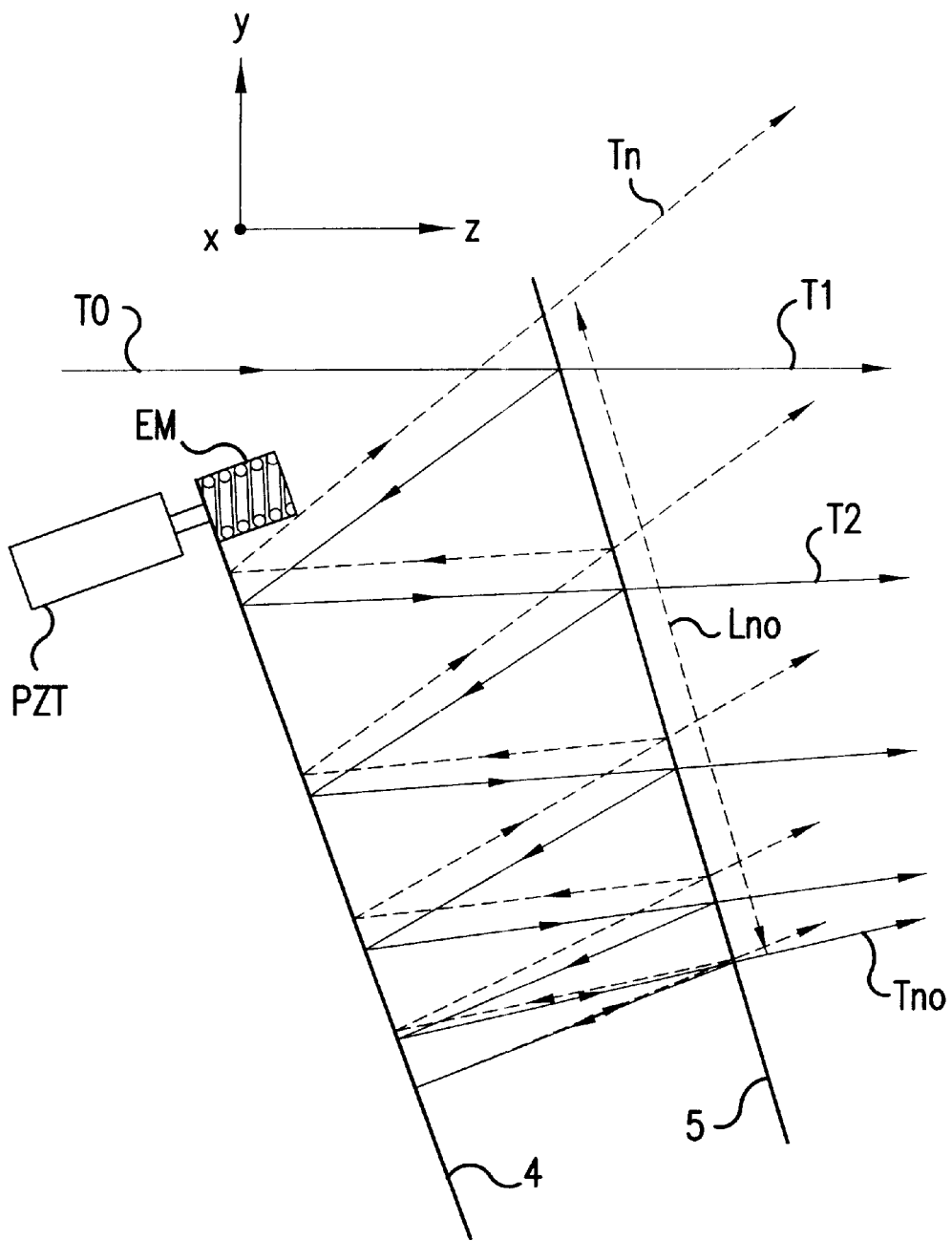
FIG. 2 illustrates the other example of said principle of the present invention.

This indicates that the emitting location of the nth transmission beam Tn overlaps that of the first transmission beam T1. Said state is shown in FIG. 2. It is to be noted that FIG. 2 is a diagram which highlights angles and the like of laser beams. In this case, in order to adjust a by a minute amount, the total reflection mirror 4 is urged by an elastic member EM, such as a spring, in advance; a piezo device PZT or a micrometer is directly brought into contact with total reflection mirror 4 from the opposite side; and a voltage is charged to said PZT as needed. In order to adjust a by a large amount, the entire mirror can be moved.

In this case, when a further increases, Ln<0 is obtained; however, since the value exceeds the effective diameter of the total reflection mirror, said value corresponds to a case that does not actually exist. For said reason, when the nth beam is used as the last beam, it is evident that, when a satisfies a condition of formula (11), an arrangement that can maximize the reduction of the effective diameter in direction y is obtained. Under said condition, the effective diameter in the direction y can be reduced by ¼ as compared to a case when α=0 is effected, which is described hereinbelow. First, when α satisfies the condition of formula (11), a point at which the advancing direction of a repetitive reflection of the beam reverses in relation to the direction y is surely presented. Said point corresponds to a point at which Ln does not change even when beam number n increases. Accordingly, the value in which Ln as in formula (10) is differentiated by n is 0. More specifically, the following formula is obtained:

$$dLn/dn = 0 \quad (12)$$

(d stands for a differential symbol.) When the differential of Ln is actually calculated, a beam number n0 for which the advancing direction of the repetitive reflection reverses in relation to the direction y is obtained by the following formula:

$$n0 = \theta/(2\alpha) + 1 \quad (13)$$

Also, by substituting said n0 and α of formula (11) for Ln of formula (10), the effective diameter is obtained as follows:

$$Ln0 = (n-1) d \cdot \theta / 2 \quad (14)$$

An accurate effective diameter Y in the direction y can be obtained by Ln0·cos θ; however, when θ is small, effective diameter Y can be approximated as Ln0.

Next, the effective diameter of multiple beams of prior art apparatus (α=0) and that of multiple beams of an apparatus as in said embodiment, when θ is small, are calculated for comparison. The effective diameter when α=0 is effected has already been given in formula (5). By substituting formula (2) solved in relation to h for formula (5), the following formula is obtained:

$$Y0 = (n-1) \cdot h = 2(n-1)\theta d \quad (15)$$

When a ratio of formula (14) and formula (15) is calculated, the following formula is obtained:

$$Ln0/Y0 = \frac{1}{4} \quad (16)$$

As it is clear from formula (16), a result in which the effective diameter when a wedge angle a is optimized is reduced by ¼ of that of prior art apparatus (α=0) is obtained. Therefore, it is evident that the effective diameter in the direction y can be significantly reduced by using the present invention.

An illumination apparatus as in embodiments of the present invention and a projection and exposure apparatus with said illumination apparatus equipped are described with reference to the attached drawings.

First Embodiment

Figure 3:
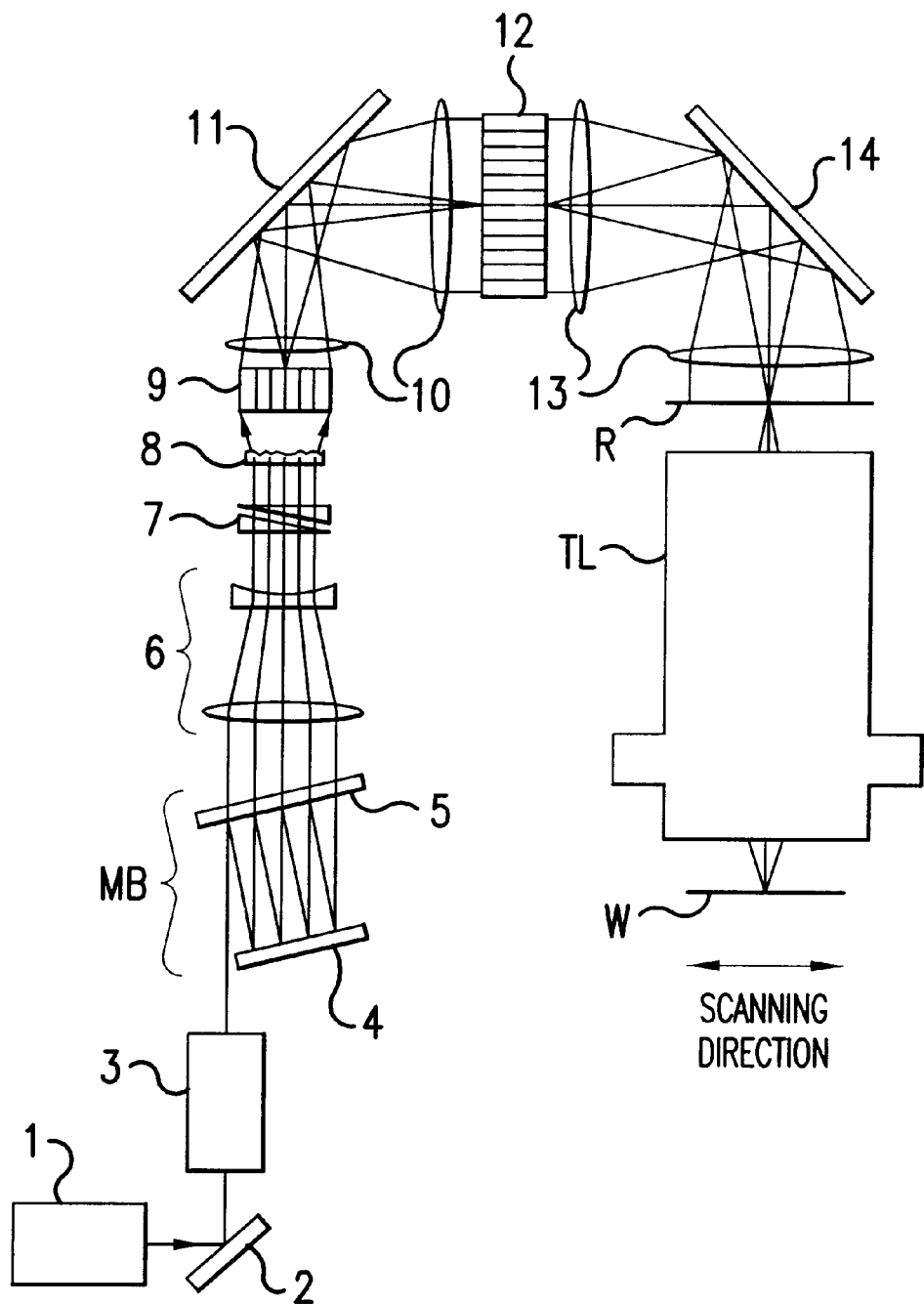
FIG. 3 is a schematic diagram of an illumination apparatus and the like in a first embodiment of the present invention.

FIG. 3 is a schematic diagram of a projection and exposure apparatus equipped with an illumination device of the first embodiment. Said apparatus is a scanning projection and exposure apparatus for manufacture of a semiconductor that scans and transfers a reticle and a wafer while they are synchronized. In this case, the scanning direction is defined as a direction y, and the direction that orthogonally crosses said scanning direction is defined as a direction x. In FIG. 3, the optical axis is bent with a returning mirror; however, a coordinate system is described by using a development diagram.

The light passage of the beam from an excimer laser 1 is bent by using a reflecting mirror 2 and rectified by using a front stage beam modifying system 3. After this, said incident beam is converted into a group of about one hundred beams while a multiple reflection is repeated in the direction y by using a multi-beam optical system MB that consists of total reflection mirror 4 and partial reflection mirror 5. In the drawing, only five beams are described for the purpose of a simplification; the remaining beams are omitted. As for a group of beams emitted from multi-beam optical system MB, the size of the effective diameter in the direction y is reduced after transmitting through a compact optical system 6; after this, said beams with said reduced effective diameter illuminate a dispersion plate 8 via a depolarizing prism 7. After a light emitted from dispersion plate 8 has transmitted through a first fly eye lens 9, the light passage is bent by a vibration mirror 11 provided within a relay optical system 10; said light with said bent light passage radiates a second fly eye lens 12. In this case, the first fly eye lens 9 performs a wave front division onto an incident light flux; according to said wave front division performed light flux multiple light source images are formed; according to lights generated from said multiple light source images when first fly eye lens 9 is used, the second fly eye lens 12 forms a substantial surface light source; in another word, the second fly eye lens 12 forms a double fly eye lens system. After this, a reticle R is illuminated via a condenser lens 13 and a reflection mirror 14. A pattern formed onto reticle R by said illuminated light is transferred onto a wafer W via a projection lens TL. When said pattern is transferred, a scanning is made while reticle R and wafer W are synchronized in the direction y. At the time, the angle of vibration mirror 11 is varied in synchronization with a laser pulse using a mechanism not shown in the drawing and from this, the angle of the light flux entering the second fly eye lens 12 is adjusted so as to average the interference noise.

In the illumination apparatus of said embodiment, the first fly eye lens 9 is structured such that 10×4 number of square element lenses with a 5 mm×5 mm effective diameter are arranged in the directions x and y, whose total effective diameter is 50 mm×20 mm. The second fly eye lens 12 is structured with 8×20 number of rectangular element lenses with 10 mm×4 mm effective diameter in the directions x and y arranged, whose total effective diameter is 80 mm×80 mm. The relay optical system 10 is structured such that an image of the total size of the first fly eye lens 9 at 50 mm×20 mm is formed around the emission surface of the element lens of the second fly eye lens 12. Each of the element lenses of the first and second fly eye lenses comprise both side convex lenses corresponding to a desired incident angle.

Figure 4:
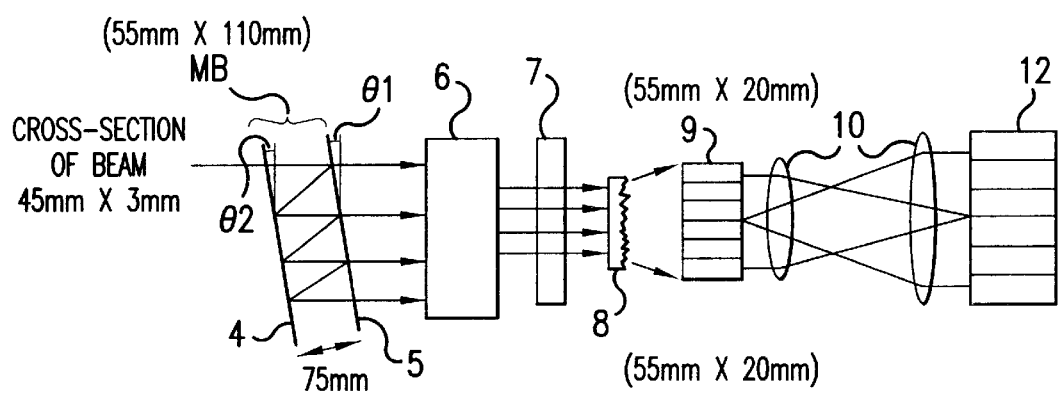
FIG. 4 illustrates the detail of a multi-beam optical system of said illumination apparatus in the first embodiment.

FIG. 4 illustrates, in more detail, a structure between the multi-beam optical system MB and the second fly eye lens 12. After the width of a beam in directions x and y, which is emitted from excimer laser 1, has been modified into the size of 45 mm×3 mm by using a front stage beam modifying system 3, said beam with said modified width enters the multi-beam optical system MB. The direction of the repetitive reflection in the multi-beam optical system MB is equivalent to the direction y (scanning direction). In FIG. 4, vibration mirror 11 is omitted for the purpose of a simplification.

The effective diameter of the multi-beam optical system MB in directions x and y is 55 mm×110 mm; the multi-beam optical system MB is structured such that the total reflection mirror 4 with an 80% or more reflection rate r0 and the partial reflection mirror 5 with an 80% or more reflection rate r face each other. In this case, if there is no absorption by the mirrors, the following values are ideally preferably effected: r0=100%; r=99%. However, when assuming the actual absorption, r0 is preferably 95% or more, and r is preferably 90% or more. As in this embodiment, more preferably, the following values are resented: r0=99%; r=96%. Also, allowable energy loss Rn of the nth beam is 1%. Since time coherence distance Lc of the excimer laser is about 150 mm, the value of L is set to L=150 mm. Since the width of the incident beam in the direction y is 3 mm, the value of h is set to h=3 mm.

When L and h as described above are substituted for formulas (1) and (2), the following values are obtained: θ=1,1460°; d=75.015 mm. When r0, r, and Rn are substituted for formula (4), a last beam number n=91 is obtained. More preferably, in order to prevent the increase of the beam diameter due to an divergence angle, the tolerance of installing angles of the total reflection mirror and the partial reflection mirror, and the occurrence of a beam kicking by inclining of said beam due to a wedge angle, a margin is preferably provided to the last beam number. In this embodiment, a calculated value n=110 which is larger than n=91 is used as the last beam number. Accordingly, by providing said margin, 91 or more beams to be substantially transmitted can be ensured.

After this, θ and n=110 are substituted for formula (11); the fourth place of decimals is omitted so as to obtain α=0.010°. As a result, the installing angle of partial reflection mirror 5 becomes θ1=1.146° in relation to axis y, and that of total reflection mirror 4 becomes θ2=1.156°.

θ and α are substituted for formula (14); the figures below the decimal point are omitted so as to obtain a returning beam number n0=58. Next, by substituting d, n0, θ, and α for formula (10), a value at 86 mm is obtained as effective diameter Ln0 in the direction y. As described above, in consideration of an effect in which the nth beam diameter increases due to the divergence angle and the easiness of adjusting a multi-beam optical system, the actual effective diameter in the direction is set to 110 mm, which has more margin than said value of 86 mm. As for said prior art example, it is necessary to have a 300 mm or more effective diameter in the direction y when the divergence angle of the beam is included; however, as in this embodiment, the effective diameter in the direction y can be reduced to 110 mm including the effect of a beam divergence.

A group of beams emitted from the multi-beam optical system MB enters a beam flux size reducing system 6; said beams entered are converted into a group of beams with a 55 mm×20 mm effective diameter. The beam flux size reducing system 6 is structured with a cylindrical lens system that reduces the size to 1/5.5 times with respect to the direction y. A group of said size reduced beams illuminate the dispersion plate 8 after transmitting through a depolarizing prism 7. The dispersion plate 8 is made of a synthetic silica glass, and an AR coating is applied onto the back surface in relation to a laser wave length; the emitting angle is 10° at a $1/e^2$ total width.

The light flux emitted from the dispersion plate 8 illuminates the first fly eye lens 9. The space between dispersion plate 8 and first fly eye lens 9 is 50 mm. The light newt flux emitted from a point of the dispersion plate 8 spreads in the form of a disc of a 8.7 mm diameter at a $1/e^2$ dispersion angle; said spread light enters the incident surface of the first fly eye lens 9. The beam space in direction y on the dispersion plate 8 is about 0.55 mm; because of this, an overlapping for a portion of about fifteen beams occurs at a point on the first fly eye lens 9. Due to said overlapping, a non-continuous intensity distribution caused by the presence of each beam by a discrete fashion is averaged. Also because each beam is expanded to the effective diameter of the element lens of the first fly eye lens 9 or larger, the Gaussian distribution which is specific to beams is also averaged. After said non-continuous intensity distribution of the illumination light has been further reduced by using the second fly eye lens 12, said illumination light with said reduced non-continuous intensity distribution eventually illuminates the reticule surface. A power of the second surface (the surface on the reticule side) of the element lens of the first fly eye lens 9 is set to generate a parallel light in relation to the emitting angle of the dispersion plate 8.

In this case, because a single reflection rate for the partial reflection mirror 5 of the multi-beam optical system MB is obtained, as the beam number of emitted beams increases as 1, 2, 3, . . . , a relative intensity is reduced. For said reason, an intensity inclination in direction y occurs to beams on the first fly eye lens 9. However, since the direction y and the scanning direction are made to coincide as described above, the inclination of the amount of a total exposure in the direction y after the scanning can be significantly reduced along with the double fly eye lens system effect.

By adjusting the angle of the vibration mirror while synchronizing with a laser pulse by using a projection optical system as in this embodiment, an exposure is made by a scanning means using a several ten pulse radiation. As a result, an excellent pattern transfer at a 1% or less exposure ununiformity can be performed. In comparison with a case when the multi-beam optical system MB is not used, the number of exposure pulses for obtaining a desired illumination uniformity can be reduced by about ¹/₄₀. Therefore, the throughput can be significantly improved.

Second Embodiment

Figure 5:
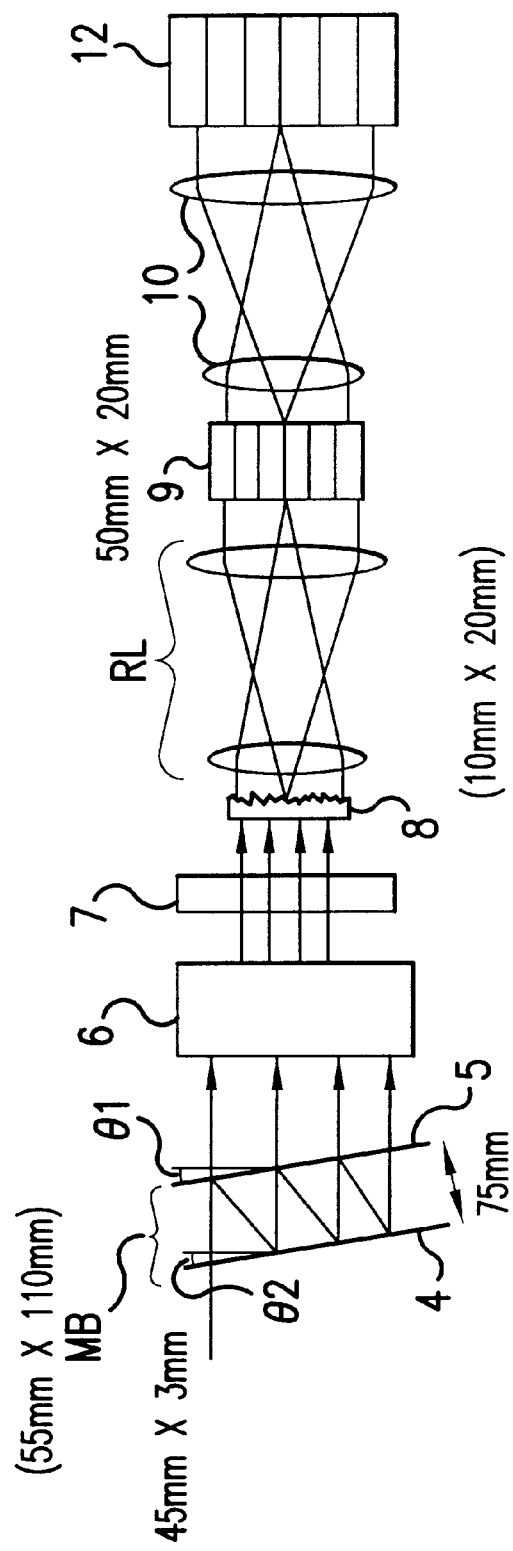
FIG. 5 illustrates the detail of a multi-beam optical system of an illumination apparatus in a second embodiment.
Figure 6:
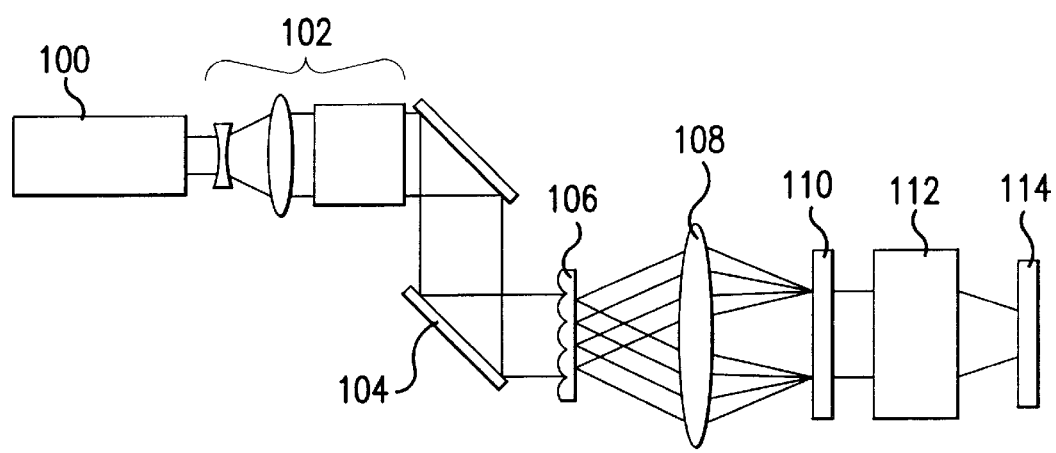
FIG. 6 illustrates a first prior art example.
Figure 7:
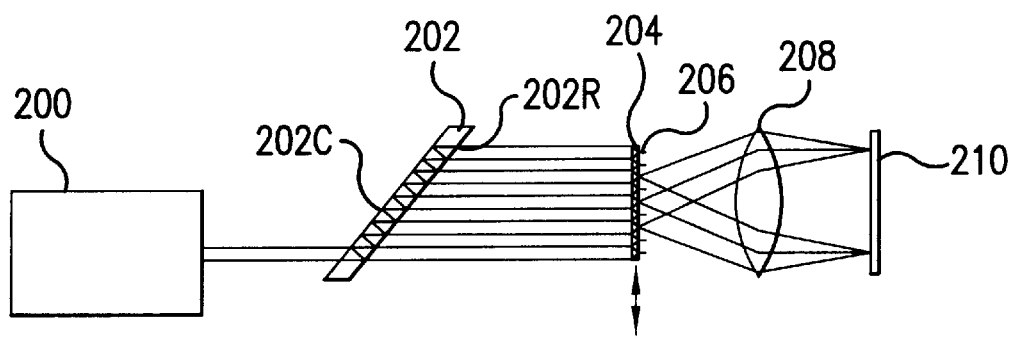
FIG. 7 illustrates a second prior art example.
Figure 8:
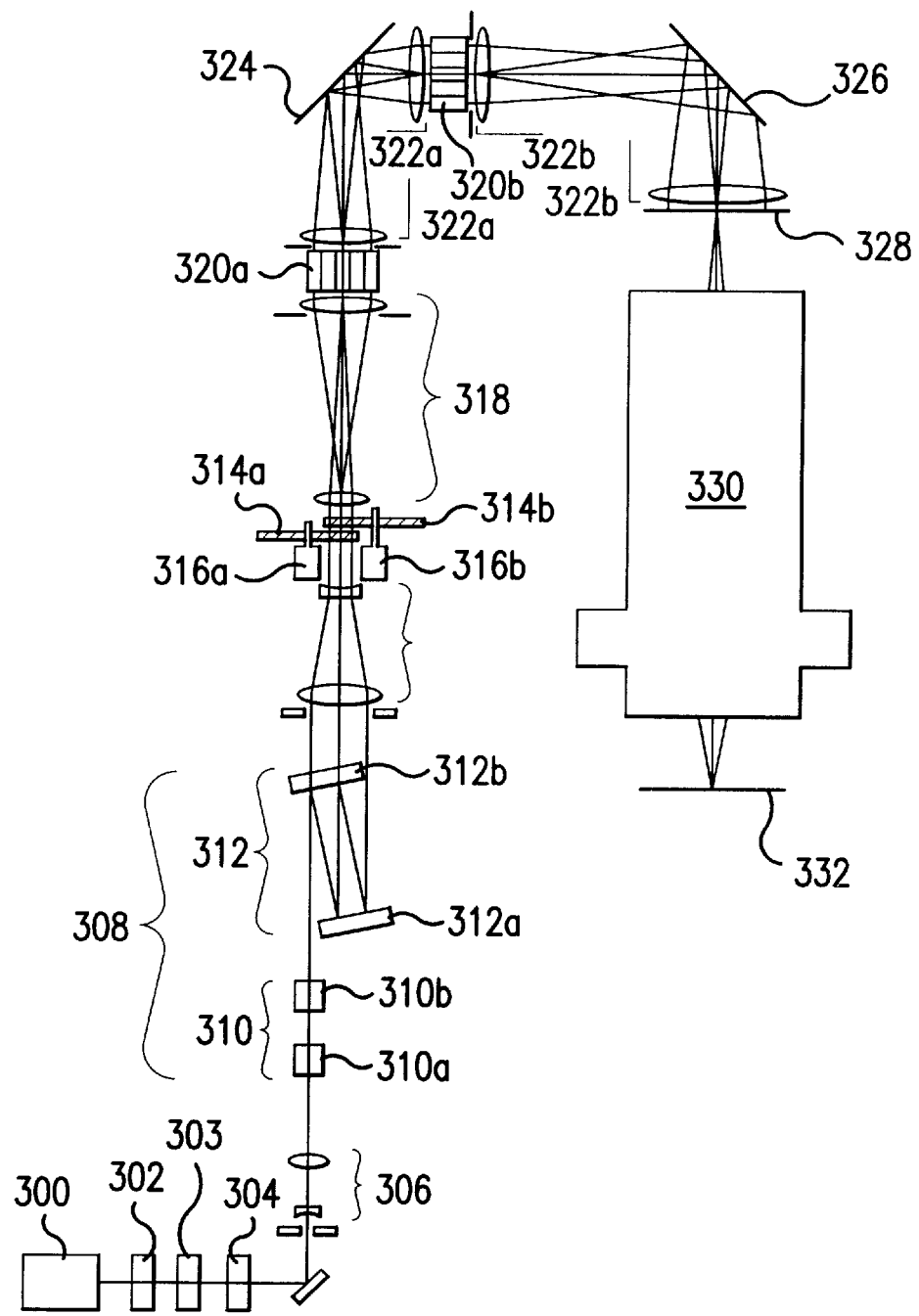
FIG. 8 illustrates a third prior art example.

FIG. 5 is a schematic diagram of a projection optical system with an illumination apparatus according to a second embodiment. Since the basic structure is equivalent to as in said first embodiment, overlapped components are omitted; components from the multi-beam optical system MB to the second fly eye lens 9 are described. The projection and exposure apparatus as in said first embodiment is suitable for a scanning exposure apparatus; the projection and exposure apparatus as in the second embodiment is suitable for both scanning and step-and-repeat exposure apparatuses. For said reasons, it is not always necessary to match the direction of multiple reflections with the scanning direction for multi-beam optical system MB as described below.

By using the multi-beam optical system MB that is used as in said first embodiment, a single beam from excimer laser 1 is converted into a group of about one hundred incoherence beams at a 3 mm beam space. The effective diameter of the entire group of said beams is 55 mm×110 mm with an estimated margin. The effective diameters of the first and second fly eye lenses and the number of element lenses are similar to those as in said first embodiment.

The difference between the second embodiment and said first embodiment is that, by arranging a relay optical system RL between the dispersion plate 8 and the first fly eye lens 9, the image of dispersion plate 8 is formed onto the emitting surface of the first fly eye lens 9 by using said relay optical system.

As for the embodiment, said group of beams emitted from the multi-beam optical system MB enter a beam flux size reducing system 6; said entered beams are converted into a group of beams with a 10 mm×20 mm effective diameter. Beam flux size reducing system 6 is as a rotary symmetrical lens system that reduces beam flux to 1/5.5 times both in directions x and y. The group of said size reduced beams illuminate a 10 mm×20 mm area on the dispersion plate 8 via a polarization eliminating prism 7. The dispersion plate 8 is made of a synthetic silicon glass; an AR coating is applied onto the back surface in relation to a laser wave length; the emitting angle is 10° at a $1/e^2$ total width.

A light flux emitted from the dispersion plate 8 illuminates the first fly eye lens 9 via the relay lens system RL. The synthetic system of the relay lens system RL and an element lens of the first fly eye lens 9 is as a image forming system; the image of the dispersion plate 8 is formed onto the emitting surface of each element lens of the first fly eye lens. Since the reduction rate of the synthetic system is ⅕ both in the directions x and y, the image size of the dispersion plate on the emitting surface of each element lens of the first fly eye lens is 2 mm×4 mm in the directions x and y. A power of the second surface (the reticule side) of the element lens of the first fly eye lens 9 is determined so that the principal ray emitted from the element lens becomes a parallel light.

In the aforesaid structure, an ununiform intensity distribution generated on the incident surface of the first fly eye lens 9 is the Gaussian type which is symmetrical to an optical axis due to an emission property of the dispersion plate 8; because of this, said ununiform intensity distribution can be sufficiently averaged by using the first and the second fly eye lenses. As a result, an intensity inclination in the direction y on the incident surface of the first fly eye lens 9 as in the first embodiment does not generate. Therefore, as for said embodiment, it is not always necessary to match the direction of multiple reflections for the multi-beam optical system with the scanning direction.

By using an illumination apparatus as in said embodiment, the angle of a vibration mirror is adjusted by using a mechanism, not shown in the drawing, while synchronizing to a laser pulse; an exposure is made by an exposure means due to a several ten pulse radiation; as a result, an excellent pattern transfer with a 1% or less exposure ununiformity can be performed. Even when the vibration mirror is used without performing a scanning, an exposure uniformity similar to the case as described above can be obtained. In comparison with a case when the multi-beam optical system MB is not used, the number of exposure pulses for obtaining a desired uniformity for illumination can be reduced by about 1/40.

As for this embodiment, a case when a 10 mm×20 mm rectangular area is used as an illumination area of the dispersion plate 8 is described; however, it is also possible to design a front stage beam modifying system and the multi-beam optical system so that the effective diameter of a beam flux during an emission of the multi-beam optical system MB is equivalent in the directions x and y. In this case, the illumination area on the dispersion plate 8 can be in a square form. As a result, an isotropic area for a dispersion plate image of the element lens of the first fly eye lens 9 can be obtained.

Instead of using said dispersion plate, a diffracting optical element (henceforth referred to as a "DOE") can be also used. In particular, in the second embodiment, when a DOE with an x and y emitting angle property which is equivalent to an x to y ratio at 5 to 2 for the effective diameter of the first fly eye lens is used, an optical energy can be focused into the effective diameter of the first fly eye lens; the illumination efficiency can be further improved.

Additionally, the DOE can form an intensity distribution as needed; for said reason, by selecting the angle property as needed, modified illumination means that have recently been gaining the popularity can be easily performed, such as an annular illumination and a four-direction illumination.

As in each embodiment as described above, a double fly eye lens system in which the fly eye lenses are arranged in two stages at the back stage of the dispersion plate is described; however, the present invention can be also applied, for example, for a single fly eye lens system in which the first fly eye lens is removed.

Furthermore, the present invention is not limited to the use of a fly eye lens system, but it can be applied to any optical integrator.

The time coherence distance for the excimer laser as in each embodiment as described above is 150 mm; however, even when the time coherence distance for a laser beam is longer than 150 mm, corresponding to said condition, the space of a mirror of the multi-beam optical system can be longer.

Also, by using said illumination apparatus as in each embodiment as described above, an exposure method that uses an illuminating process that illuminates said mask provided onto the object surface, and a projecting process that projects a pattern image of said mask onto a photosensitive substrate provided onto the surface of the last image can be offered.

As described above, the present invention applies a structure in which the beam space is gradually reduced with repeated reflections while the relative angle of a total reflection mirror of a one-dimensional multi-beam optical system and a partial reflection mirror is displaced from a parallel state; by means of this, the effective diameter in the direction y is minimized. By providing a dispersion plate and the like to the back stage of the one-dimensional multi-beam optical system, because each beam diameter is made to enter while it is expanded to that of an element lens of a fly eye lens or larger, an interference noise due to the fly eye lens and the Gaussian intensity distribution of a beam can be corrected at the same time. A relative alignment for the multi-beam optical system and the fly eye lens is easily made.

Accordingly, by using a compact multi-beam optical system with a simple structure and an optical dispersion means, an ununiform Gaussian intensity distribution due to an excimer laser beam and an interference noise due to a fly eye lens generated onto a reticle can be reduced at the same time. The uniformity of intensity on the reticle can be improved without reducing the throughput; as a result, the accuracy of a pattern transfer significantly improves.

What is claimed:

1. An illumination apparatus that illuminates a mask with a predetermined pattern, comprising:
   a light source that supplies a light beam;
   a multi-beam forming optical system that includes a reflecting member and a light splitting member and that converts said light beam into a group of multiple beams; said light splitting member and said reflecting member being inclined with respect to each other at some non-zero angle chosen so that a first partial transmitted beam emitted from said light splitting member at a first point and an nth partial transmitted beam emitted from said light splitting member at an nth point are convergent and so that the distance between the first point and the nth point on the light splitting member is shorter as compared to the distance between the first point and the nth point when the light splitting member and the light reflecting member are parallel with respect to each other.

2. An illumination apparatus according to claim 1, further comprising:
   an optical integrator that forms multiple light source images from multiple beams generated by multi-beam forming optical system.

3. An illumination apparatus according to claim 2, wherein said multi-beam forming optical system is structured such that the difference in length of light passages of two adjacent beams within the group of said multiple beams is adjusted to be the coherence length of said light source or longer.

4. An illumination apparatus according to claim 3, further comprising:
   a condenser optical system that guides a light that passes to the mask.

5. An illumination apparatus according to claim 4 further comprising:
   a dispersion section that disperses the diameter of each beam such that said diameter becomes larger.

6. An illumination apparatus according to claim 5 further comprising:
   a relay lens system provided between said dispersion section and the mask.

7. An illumination apparatus according to claim 2, further comprising:
   a condenser optical system that guides a light that passes to the mask.

8. An illumination apparatus according to claim 2, further comprising:
   a dispersion section that disperses the diameter of each beam such that said diameter becomes larger.

9. An illumination apparatus according to claim 8 further comprising:
   a relay lens system provided between said dispersion section and the mask.

10. An illumination apparatus according to claim 8, wherein said dispersion section is a diffractive optical element.

11. A projection and exposure apparatus, comprising:
    a first stage that holds the mask;
    an illumination apparatus that illuminates said mask, as recited in claim 2;
    a second stage that holds a substrate to be exposed; and
    a projection optical system that projects and exposes a pattern image of said mask illuminated by using said illumination apparatus onto said substrate to be exposed.

12. A projection and exposure apparatus according to claim 11, wherein the projection and exposure apparatus is as a scanning projection and exposure apparatus in which at least one of said mask and said substrate move relative to said projection and exposure apparatus.

13. An illumination apparatus according to claim 2, wherein at lease one of said reflecting member and light splitting member is planar.

14. An illumination apparatus according to claim 2, further comprising:
    an angle adjusting mechanism, that varies the inclination angle between said reflecting and light splitting members.

15. An illumination apparatus according to claim 2 wherein the angle between said reflecting member and said light splitting member is set so that at some point along the said reflecting member a reflected light ray will reflect back directly to the point on the said light splitting member at which the original incident ray impinged.

16. An illumination apparatus according to claim 2 wherein,
said distance between the first point and the nth point on the light splitting member is substantially zero.

17. An illumination apparatus according to claim 2, further comprising:
a depolarizing element, disposed between said light source and said optical integrator and reducing and/or randomizing the polarization of light incident thereon.

18. An illumination apparatus according to claim 17 further comprising:
a dispersion section that disperses a beam incident thereon to make a diameter of the beam larger.

19. An illumination apparatus according to claim 1, wherein the reflection ratio 'r' is at least 50%.

20. An illumination apparatus according to claim 19, wherein said predetermined nth transmitted ray is determined, by given reflection ratios 'r', '$r_0$', and given energy of the desired nth reflected ray 'Rn', by the relationship n=ln(Rn/r)/ln(r×r0)+1.

21. An illumination apparatus according to claim 20, wherein said predetermined non-zero angle a lies in a range, related to a predetermined nth transmitted ray and the angle the incident ray makes with said light splitting member θ, expressed by the relationship $0.5\times\theta/(n-1) \leq \alpha \leq 1.5\times\theta/(n-1)$.

22. An illumination apparatus according to claim 1, wherein
a.) said predetermined nth transmitted ray is determined, by given reflection ratios 'r', '$r_0$', and given energy of the desired nth reflected ray 'Rn', by the relationship n=ln(Rn/r)/ln(r×r0)+1, or
b.) said predetermined non-zero angle a lies in a range, related to a predetermined nth transmitted ray and the angle the incident ray makes with said light splitting member θ, expressed by the relationship $0.5\times\theta/(n-1) \leq \alpha \leq 1.5\times\theta/(n-1)$.

23. A method of reducing coherency of light comprising:
a) positioning a reflecting member and a light splitting member wherein the members are inclined at a predetermined angle with respect to each other so that a first partial transmitted beam emitted from said light splitting member at a first point and an nth partial transmitted beam emitted from said light splitting member at an nth point are convergent and so that the distance between the first point and the nth point on the light splitting member is shorter as compared to the distance between the first point and the nth point when the light splitting member and the light reflecting member are parallel with respect to each other.

24. An exposure method of claim 23 further comprising: using said integrated beam to illuminate a mask; and projecting a pattern image of said mask onto a photosensitive substrate.

25. A method of reducing coherency according to claim 23, wherein the reflection ratio 'r' is at least 50%.

26. A method of reducing coherency according to claim 25, wherein said predetermined nth transmitted ray is determined, by given reflectance ratios 'r', '$r_0$', and given energy of the desired nth reflected ray 'Rn', by the relationship n=ln(Rn/r)/ln(r×r0)+1.

27. A method of reducing coherency according to claim 26, wherein said predetermined angle α lies in a range, related to a predetermined nth transmitted ray and the angle the incident ray makes with said light splitting member θ, expressed by the relationship $0.5\times\theta/(n-1) \leq \alpha \leq 1.5\times\theta/(n-1)$.

28. A method of reducing coherency according to claim 23, wherein
a.) said predetermined nth transmitted ray is determined, by given reflection ratios 'r', '$r_0$', and given energy of the desired nth reflected ray 'Rn', by the relationship n=ln(Rn/r)/ln(r×r0)+1, or
b.) said predetermined non-zero angle α lies in a range, related to a predetermined nth transmitted ray and the angle the incident ray makes with said light splitting member θ, expressed by the relationship $0.5\times\theta/(n-1) \leq \alpha \leq 1.5\times\theta/(n-1)$.

29. An illumination apparatus that illuminates a mask with a predetermined pattern, comprising:
a light source that supplies a light beam;
a multi-beam forming optical system that includes a reflecting member and a light splitting member and that converts said light beam into a group of multiple beams, said light beam being supplied to said light splitting member and said reflecting member to be at least partially reflected therebetween, said light splitting member and said reflecting member being inclined with respect to each other at a predetermined non-zero angle chosen so that a first partial transmitted beam emitted from said light splitting member and an nth partial transmitted beam emitted from said light splitting member are convergent; and
an optical integrator receiving the plural partial transmitted beams from said multi-beam forming optical system to form multiple image sources therefrom.

30. An illumination apparatus according to claim 29, wherein the reflection ratio 'r' is at least 50%.

31. An illumination apparatus according to claim 30, wherein said predetermined nth transmitted ray is determined, by given reflection ratios 'r', '$r_0$', and given energy of the desired nth reflected ray 'Rn', by the relationship n=ln(Rn/r)/ln(r×r0)+1.

32. An illumination apparatus according to claim 31, wherein said predetermined non-zero angle α lies in a range, related to a predetermined nth transmitted ray and the angle the incident ray makes with said light splitting member θ, expressed by the relationship $0.5\times\theta/(n-1) \leq \alpha \leq 1.5\times\theta/(n-1)$.

33. An illumination apparatus according to claim 29, wherein
a.) said predetermined nth transmitted ray is determined, by given reflection ratios 'r', '$r_0$', and given energy of the desired nth reflected ray 'Rn', by the relationship n=ln(Rn/r)/ln(r×r0)+1, or
b.) said predetermined non-zero angle α lies in a range, related to a predetermined nth transmitted ray and the angle the incident ray makes with said light splitting member θ, expressed by the relationship $0.5\times\theta/(n-1) \leq \alpha \leq 1.5\times\theta/(n-1)$.

34. An illumination apparatus that illuminates a mask with a predetermined pattern, comprising:
a light source that supplies a light beam;
a multi-beam forming optical system that includes a reflecting member and a light splitting member and that converts said light beam into a group of multiple beams, said light splitting member and said reflecting member being inclined with respect to each other at a predetermined non-zero angle chosen so that a first partial transmitted beam emitted from said light splitting member at a first point and an nth partial transmitted beam emitted from said light splitting member at an nth point are convergent and so that at some point along the said reflecting member a reflected light ray will reflect back toward the point on the said light splitting member at which the original incident ray impinged.

35. An illumination apparatus according to claim 34, wherein the reflection ratio 'r' is at least 50%.

36. An illumination apparatus according to claim 35, wherein said predetermined nth transmitted ray is determined, by given reflection ratios 'r', '$r_0$', and given energy of the desired nth reflected ray 'Rn', by the relationship $n=\ln(Rn/r)/\ln(r \times r0)+1$.

37. An illumination apparatus according to claim 36, wherein said predetermined non-zero angle α lies in a range, related to a predetermined nth transmitted ray and the angle the incident ray makes with said light splitting member θ, expressed by the relationship $0.5 \times \theta/(n-1) \leq \alpha \leq 1.5 \times \theta/(n-1)$.

38. An illumination apparatus according to claim 34, wherein a.) said predetermined nth transmitted ray is determined, by given reflection ratios 'r', '$r_0$', and given energy of the desired nth reflected ray 'Rn', by the relationship $n=\ln(Rn/r)/\ln(r \times r0)+1$, or b.) said predetermined non-zero angle α lies in a range, related to a predetermined nth transmitted ray and the angle the incident ray makes with said light splitting member θ, expressed by the relationship $0.5 \times \theta/(n-1) \leq \alpha \leq 1.5 \times \theta/(n-1)$.

* * * * *